(12) United States Patent
Kanao

(10) Patent No.: US 6,388,511 B1
(45) Date of Patent: May 14, 2002

(54) FILTER CIRCUIT

(75) Inventor: Katsuhiro Kanao, Hannan (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/419,455

(22) Filed: Oct. 15, 1999

(30) Foreign Application Priority Data

Oct. 16, 1998 (JP) .............................................. 10-295901

(51) Int. Cl.[7] ................................................ H03K 5/00
(52) U.S. Cl. ........................ 327/558; 327/552; 327/559
(58) Field of Search .................................. 327/552, 553, 327/558; 330/107, 105; 333/172

(56) References Cited

U.S. PATENT DOCUMENTS 5,168,180 A * 12/1992 Bayer et al. ................. 327/558
5,412,335 A * 5/1995 Jackson et al. ............. 327/552
5,598,124 A * 1/1997 Kirchhoff .................... 327/552
5,659,264 A * 8/1997 Ariyoshi et al. ............ 327/513

* cited by examiner

*Primary Examiner*—Dinh T. Le
(74) *Attorney, Agent, or Firm*—William B. Kempler; Frederick J. Telecky, Jr.

(57) ABSTRACT

Offers a filter circuit in which the dedicated capacitor surface area is small and in which a dedicated process just for capacitor formation is unnecessary. The filter circuit of this invention is an active filter circuit wherein an operational amplifier AMP1 and capacitors (C1, C2) are formed on the same semiconductor substrate. The capacitors (C1, C2) are constructed from an insulated gate field effect transistor wherein the mutually connected source and drain forms one of the electrodes, the gate forms the other electrode, and the gate insulating film is used in the capacitor dielectric film. For capacitor C1, a DC bias means (DC bias circuit V2) that applies a prescribed DC bias is connected between the electrodes of the said capacitor. A DC bias means can also be provided at capacitor C2, but here, it can be omitted by just increasing the DC level of the input signal Vin just a prescribed level.

4 Claims, 3 Drawing Sheets

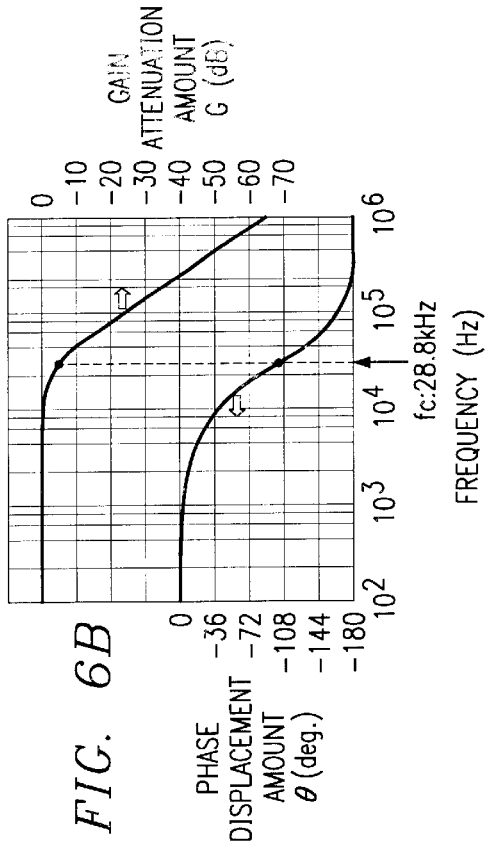

FIG. 6B

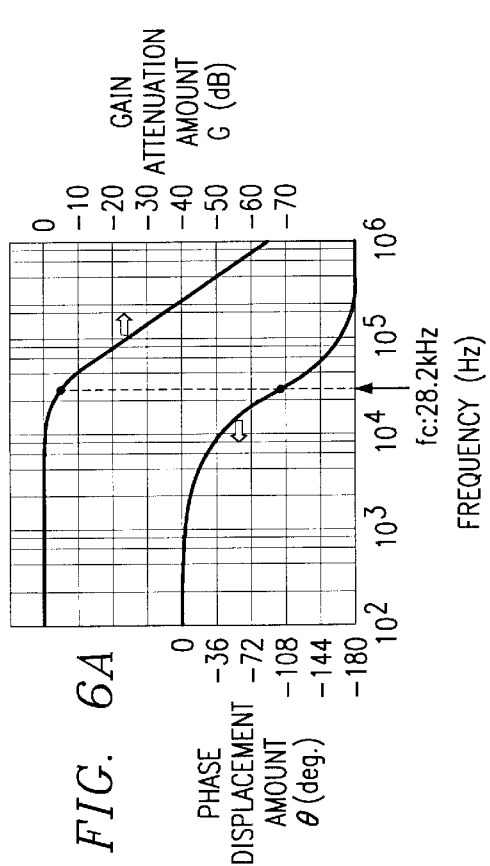

FIG. 6A

| PARAMETER | GATE INSULATING FILM CAPACITOR | METAL CAPACITOR (POLY-MET1-MET2-MET3) | POLY-POLY |
|---|---|---|---|
| FILM THICKNESS | 8nm | ABOUT 700nm | 50nm |
| CAPACITY PER UNIT SURFACE AREA | $4.3fF/\mu m^2$ | $0.15fF/\mu m^2$ | $0.7fF/\mu m^2$ |
| (SURFACE AREA) | | | |
| Ctotal=125pF | $29k\mu m^2$ | $833k\mu m^2$ | $179k\mu m^2$ |
| R=200kΩ ($1.5k\mu m^2$) | $R*13=19.5k\mu m^2$ | $R*8=12k\mu m^2$ | $R*8=12k\mu m^2$ |
| AMP ($40k\mu m^2$) | $AMP*4=160k\mu m^2$ | $AMP*2=80k\mu m^2$ | $AMP*2=80k\mu m^2$ |
| (TOTAL SURFACE AREA) | $208.5k\mu m^2$ | $925k\mu m^2$ | $271k\mu m^2$ |

FIG. 7

FILTER CIRCUIT

FIELD OF THE INVENTION

This invention relates to an active filter circuit that uses capacitors and operational amplifiers.

BACKGROUND OF THE INVENTION

FIG. 8 is a schematic showing the construction of a general active filter circuit.

The low pass filter LPF shown in FIG. 8, which is one example of an active filter, is constructed of an operational amplifier AMP, capacitors C1, C2, and resistors R1, R2.

The resistor R1 and the resistor R2 are connected in series between the input terminal Tin to which the input signal Vin is input and the non-inverted input (+) for the operational amplifier. The capacitor C1 is connected between the non-inverted input (+) of the operational amplifier AMP and the reference potential GND.

The capacitor C2 is connected between the connection point for the resistors R1, R2 and the inverted input (−) of the operational amplifier input. The inverted input (−) of the operational amplifier AMP is connected to the amplifier output, and negative feedback is applied. The output of the operational amplifier AMP is connected to the output terminal Tout, and the output signal Vout is taken out from the output terminal Tout.

With this conventional filter circuit, there is no capacitance voltage dependency and capacitors with a large capacitive value are necessary. In forming these capacitors on the same wafer as the operational amplifier in the semiconductor manufacturing process, a dedicated process was necessary for the purpose of capacitor formation. Because of this, the number of processes for the semiconductor manufacturing process was large, and the process costs became high.

The purpose of this invention is to offer a filter circuit in which the capacitor dedicated surface area is small, and a dedicated process just for capacitor formation is unnecessary.

SUMMARY OF THE INVENTION

In the filter circuit of this invention, for example, in the case of a general-purpose logic mixed loading and the like, an insulated gate field effect transistor is used as a filter circuit that is housed in the semiconductor device, the source and drain of the insulated gate field effect transistor MOS transistor are connected in common, and this is used as the capacitor by using the gate insulating film. At that time, this is a configuration in which the channel for the transistor is not ordinarily formed. The capacitor value is not fixed but shows a voltage dependency in which the capacitor value during low voltage is extremely small. In order to solve this problem, in this invention, a DC bias means is provided.

In other words, the filter circuit related to this invention has a first operational amplifier, a plurality of resistors that are electrically connected to the above-mentioned first operational amplifier, a plurality of capacitors that are electrically connected to the above-mentioned first operational amplifier, wherein in each the source and drain of an MOS transistor are connected and become one of the electrodes, and the gate of the said MOS transistor becomes the other electrode, a DC bias means that applies a prescribed DC bias between the electrodes of the above-mentioned capacitors, and the above-mentioned first operational amplifier, the above-mentioned resistors, the above-mentioned capacitors, and the above-mentioned DC bias means are formed on the same semiconductor substrate.

This filter circuit can be a low pass filter or a high pass filter.

A DC bias means can be provided at the first capacitor and the second capacitor, respectively, but preferably, one of those can be eliminated by means of increasing the input signal level a prescribed amount.

In a filter circuit with this type of construction, the capacitive value per unit surface area can be large due to the fact that the capacitor is formed by using a thin high-quality gate insulating film, and moreover, it can be formed simultaneously with another insulating gate field effect transistor.

Also, due to the fact that a prescribed DC bias voltage can always be applied to each capacitor by means of a DC bias means, the capacitive value of a capacitor using a gate insulating film does not show a voltage dependency.

BRIEF DESCRIPTION OF THE DRAWINGS

FIG. 6 is a graph showing the evaluation results of the frequency characteristics of the second order low pass filter LPF shown in FIG. 4 along with the frequency characteristics of a reference (comparison example).

FIG. 7 is a table showing each parameter (dielectric film thickness, capacity per unit of surface area) and the surface area of the capacitor, resistor, and operational amplifier in a fourth order low pass filter compared with the Conventional Examples 1 and 2.

Figure 1:
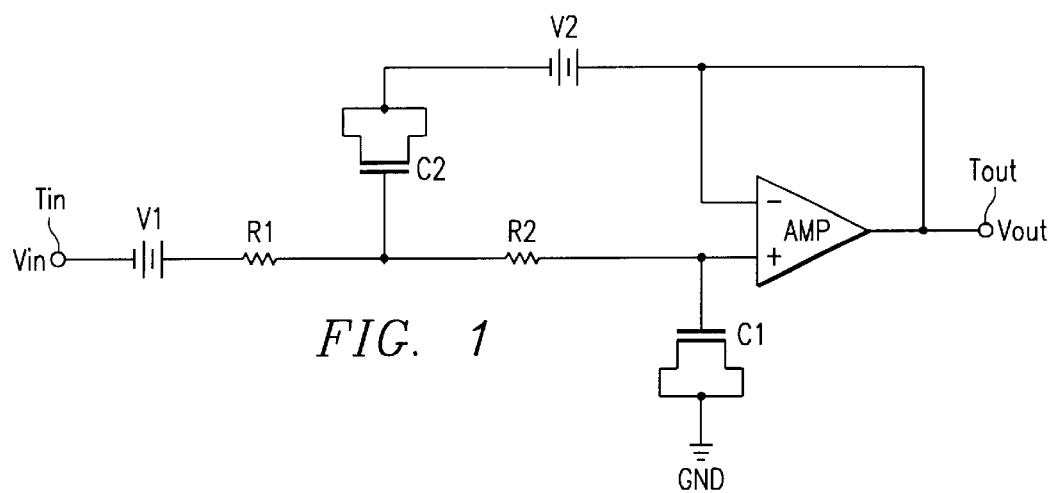
FIG. 1 is a schematic for a low pass filter LPF related to an embodiment configuration of this invention.

REFERENCE NUMERALS AND SYMBOLS AS SHOWN IN THE DRAWINGS 1 is a semiconductor substrate; 1a is a source impurity region; 1b is a drain impurity region; 2 is a gate insulating film; 4 is a gate electrode; LPF represents a low pass filter and HPF a high pass filter; AMP, AMP1, and AMP2 are operational amplifiers; V1 and V2 are DC bias circuits (DC bias means); C1 and C2 are gate insulating film capacitors (first and second capacitance); R1 and R2 are resistors (first and second resistor); R3 to R7 are resistors; M indicates an MOS transistor; Tin the input terminal; Tout the output terminal; Vin the input signal or input voltage; Vout the output signal or output voltage; Vcc the power supply voltage; GND the ground potential (reference potential), and VG1, VG2, VDS1, VDS2, and Vbias indicate the potential of each node.

DESCRIPTION OF THE EMBODIMENTS

Figure 2:
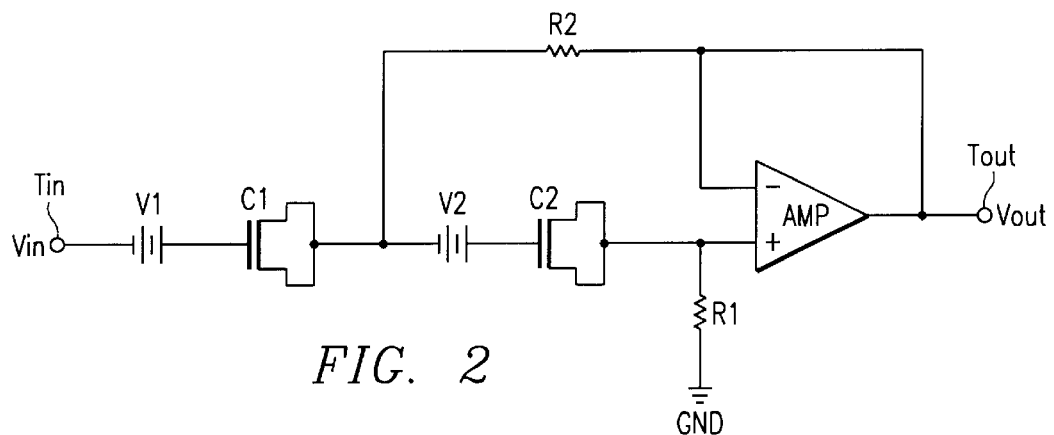
FIG. 2 is a schematic for a high pass filter HPF related to an embodiment configuration of this invention.

FIG. 1 is a schematic of a low pass filter LPF, and FIG. 2 is a schematic of a high pass filter HPF, related to this invention. FIG. 3 presents diagrams showing the cross-sectional construction and the circuit construction of a capacitor that is used in the filter circuit of this embodiment configuration.

These filters LPF, HPF are constructed of an operational amplifier AMP, capacitors C1, C2, resistors R1, R2 and the DC bias means V1, V2.

The capacitors C1, C2 have a construction in which the gate insulating film of an MOS transistor is used as the capacitor dielectric film. Below, a capacitor of this construction is called a "gate insulating film capacitor."

Figure 3A:
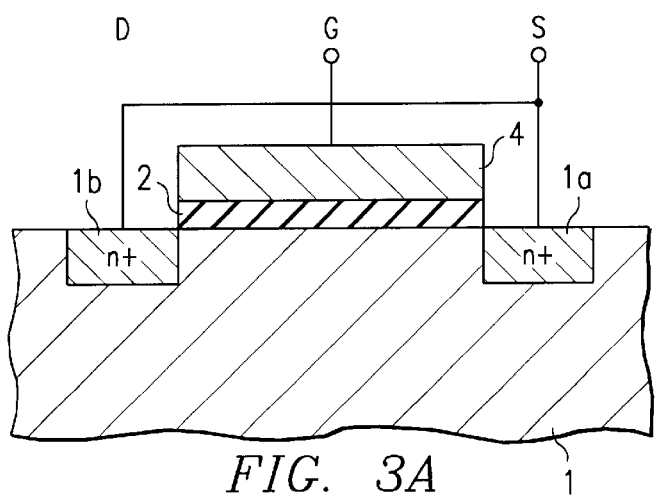
FIG. 3 is a diagram showing the cross-sectional construction, and the circuit construction of a capacitor that is used in the filter of the embodiment configuration of this invention.
Figure 3B:
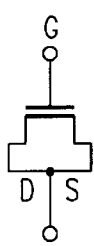

In the gate insulating film capacitors C1, C2, as is shown in FIG. 3(A), a gate insulating film 2 and a gate electrode 4 are deposited on a semiconductor substrate 1, such as a silicon wafer, and a source impurity region 1a and a drain impurity region 1b that are formed on the semiconductor substrate on both sides of the gate electrode 4 are shorted by a not illustrated wiring layer or the like. Also, a channel is formed between the source impurity region 1a and drain impurity region 1b, the impurity regions 1a, 1b and the channel are made the lower electrode of the capacitor, the gate electrode is made the upper electrode of the capacitor, and the gate insulating film between the channel and the gate electrode is used as the dielectric film of the capacitor.

The DC bias means V1, V2 always apply a prescribed DC bias voltage between the capacitor electrodes of the gate insulating film capacitors C1, C2, and are provided in order to maintain the forming condition for the channels. For the DC bias means V1, V2, a DC power supply is connected in series with the gate insulating film capacitors C1, C2, or a DC bias circuit of a construction that is explained later can be used. If the DC bias means is directly connected to the input terminal Tin to which the signal is input, a DC bias means (in other words, the DC bias means V1 in FIG. 1 and 2 can be omitted by offsetting by a prescribed amount the DC level of the input voltage Vin.

In the low pass filter LPF shown in FIG. 1, the DC bias means V1, the resistor R1, and the resistor R2 are series connected between the input terminal Tin to which the input signal Vin is input and the non-inverted input (+) of the operational amplifier AMP. The gate insulating film capacitor C1 is connected between the non-inverted input (+) of the operational amplifier AMP and the reference potential GND.

The gate insulating film capacitor C2 and the DC bias means V2 are series connected between the connection point between the resistors R1, R2 and the inverted input (−) of the operational amplifier AMP. The inverted input (−) of the operational amplifier AMP is connected to the [amplifier] output, and a negative feedback is applied. The output of the operational amplifier AMP is connected to the output terminal Tout, and the output signal Vout is taken out from the output terminal Tout.

In the high pass filter HPF shown in FIG. 2, the DC bias means V1, the gate insulating film capacitor C1, the DC bias means V2, and the gate insulating film capacitor C2 are series connected between the input terminal Tin to which the input signal Vin is input and the non-inverted input (+) of the operational amplifier AMP. The resistor R1 is connected between the non-inverted input (+) of the operational amplifier AMP and the reference potential GND.

The resistor R2 is connected between the connection point between the gate insulating film capacitor C1 and the DC bias means V2 and the inverted input (−) of the operational amplifier AMP. The inverted input (−) of the operational amplifier AMP is connected to the [amplifier] output, and a negative feedback is applied. The output of the operational amplifier AMP is connected to the output terminal Tout, and the output signal Vout is taken out from the output terminal Tout.

Below, the details of a filter circuit related to this embodiment configuration are explained, exemplified in the low pass filter LPF.

Figure 4:
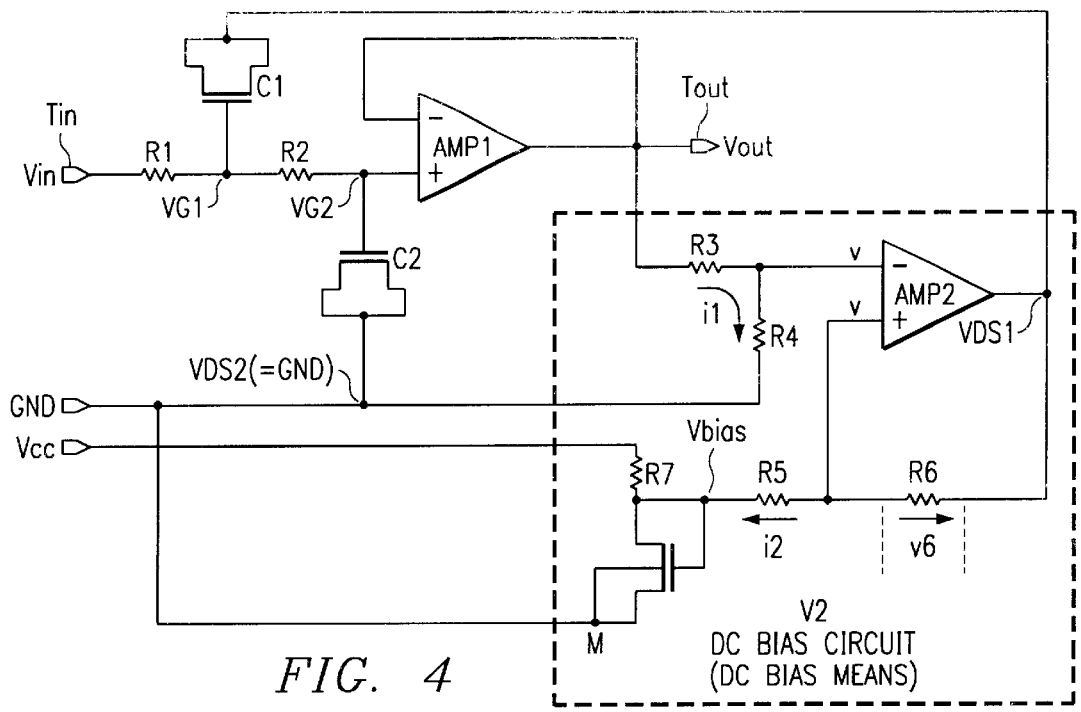
FIG. 4 is a schematic showing a concrete construction example of a low pass filter LPF.

FIG. 4 is a schematic showing one concrete construction example of a low pass filter LPF.

In FIG. 4, the DC bias circuit V2 is constructed of the operational amplifier AMP2, the resistors R3 to R7, and the MOS transistor M.

The resistor R3 and the resistor R4 are series connected between the output of the operational amplifier (in this circuit, shown by AMP 1) from which the output signal Vout is taken out and a reference potential, for example, the supply line for the ground potential GND, and that R3, R4 connecting point is connected to the non-inverted input (+) of the operational amplifier AMP2. The output of the operational amplifier AMP2 is connected to the gate insulating film capacitor C1.

On the other hand, the resistor R7 and the MOS transistor M are series connected between the power supply voltage Vcc and the supply line for the ground potential GND. The resistor R5 and the resistor R6 are series connected between the connection point for the resistor R7 and the N channel MOS transistor M, and the output of the operational amplifier AMP2. The connecting point for the resistor R5 and the resistor R6 is connected to the inverted input (−) of the operational amplifier AMP2. The gate and drain of the MOS transistor M are connected, a diode is constructed, and the source and substrate are connected.

In this circuit, the DC bias means V1 shown in FIG. 1 is omitted, and the DC level of the input signal Vin is offset high by a prescribed voltage, for example, about 0.6 V.

Now, as is shown in FIG. 4, the potential of the connecting point for the resistor R1 and the resistor R2 to which the gate insulating film capacitor C1 is connected is taken as VG1, the potential of the non-inverted input (+) of the operational amplifier AMP1 to which the gate insulating film capacitor C2 is connected is taken as VG2, the output potential of the operational amplifier AMP2 is taken as VDS1, and the potential of the connecting point of the resistor R7 and the MOS transistor M is taken as Vbias. Also, as for the operational amplifier AMP2, because the input impedance is high and almost no current flows in the input, the current that flows in resistor R3 and resistor R4 is taken as i1, the current that flows in resistor R5 and resistor R6 as i2, and the direction of these currents is as illustrated.

As for the operational amplifier AMP1, a negative feedback is applied, and since a virtual short can be applied between the input terminals, the output potential Vout=VG2. At this time, the current i1 which flows through the resistor R3 and the resistor R4 is expressed by the following equation $$i1 = VG2/(R3+R4) \tag{1}$$

As for the operational amplifier AMP2, negative feedback is applied through the medium of the resistor R6, and since a virtual short can be applied between the input terminals, the potential of the input terminals (+) and (−) of the operational amplifier AMP2 are both taken to be v. v used as the voltage drop of the resistor R4 is expressed by the following equation.

$$v = R4 \cdot i1 \quad (2)$$
$$= VG2 \cdot R4/(R3 + R4)$$

Here, if the voltage that is applied across the resistor R6 is taken to be v6, the output voltage VDS1 of the operational amplifier AMP2 is expressed by the following equation using the above-mentioned equation 2.

$$VDS1 = v + v6 \quad (3)$$
$$= v + R6 \cdot i2$$
$$= v + (R6/R5)(v - V\ bias)$$
$$= (1 + R6/R5)v - (R6/R5)Vbias$$
$$= R4/(R3 + R4) \cdot (1 + R6/R5)VG2 - (R6/R5)Vbias$$

Here, if it is assumed that (R4/R3)=(R6/R5)=1, hence Ry=R3 the above-mentioned Equation 3 can be abbreviated by the following equation.

$$VDS1 = VG2 - Vbias \quad (4)$$

In a prescribed frequency region in which the signals are not attenuated through the medium of the gate insulating film capacitors C1, C2, VG2=VG1 is established. Because of this, by means of the DC bias circuit V2, a prescribed bias of Vbias can always be applied to the ends of the gate insulating film capacitor C1, and it becomes possible to hold constant the capacitive value of the gate insulating film capacitor C1.

Now then, because a prescribed DC bias value is applied to the input signal Vin, the capacitive value for the gate insulating film capacitor C2 is also maintained constant.

Figure 5:
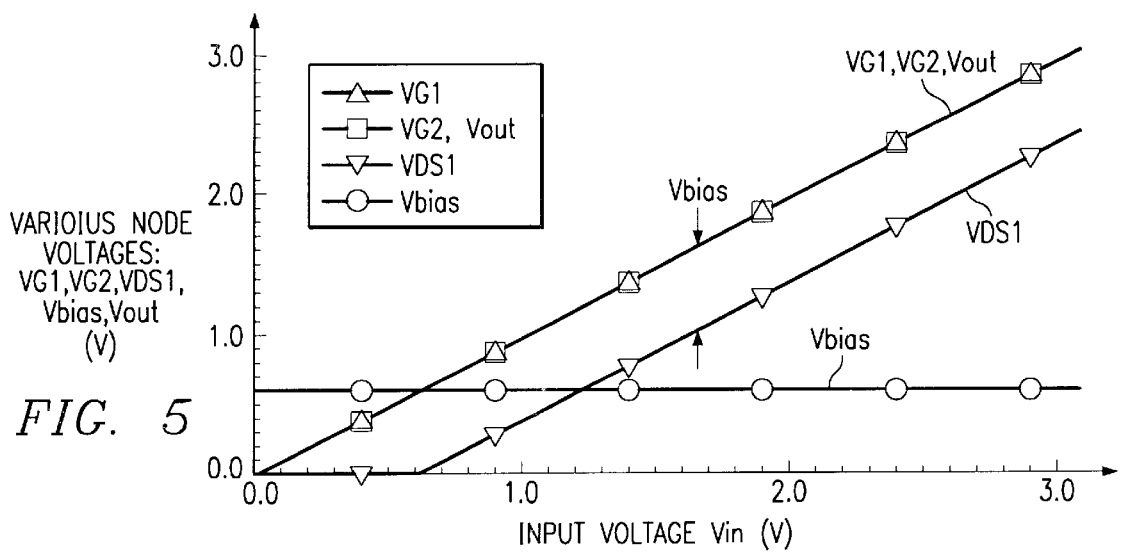
FIG. 5 is a graph showing the DC simulation results for the low pass filter LPF shown in FIG. 4.
Figure 8:
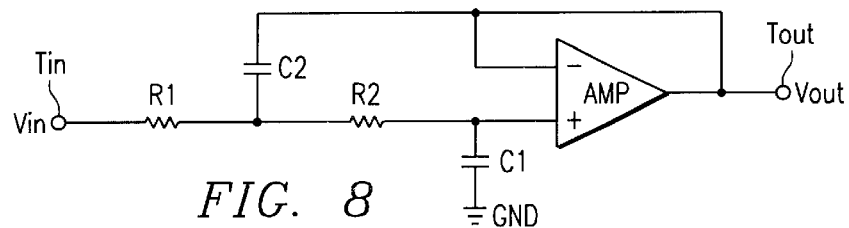
FIG. 8 is a schematic showing a construction example of a conventional active filter.

FIG. 5 is a graph showing the DC simulation results for the low pass filter LPF shown in FIG. 4. In FIG. 5, the abscissa shows the input voltage Vin, and the ordinate shows the output voltage V out, and each gate potential VG1, VG2, VDS1, and Vbias.

From this FIG. 5, it can be seen that when the input voltage Vin is above Vbias (0.6 V), the output voltage VDS1 of the operational amplifier AMP2 is held lower than the output voltage Vout and the node voltages VG1, VG2 by exactly Vbias, and as a result of this, a constant voltage Vbias is always applied to both ends of the gate insulating film capacitor C1.

FIG. 6(A) is a graph showing the evaluation results of the frequency characteristics of the second order low pass filter LPF shown in FIG. 4. Also, FIG. 6(B), as a reference (comparison example), is a graph showing the frequency characteristics of this second order low pass filter LPF where gate insulating film capacitors C1, C2, are replaced by capacitors of a construction in which the dielectric film is sandwiched by two layers of polysilicon as manufactured by the DRAM [manufacturing] process.

From this FIG. 6, [it can be seen that] the same characteristics as the comparison example can be obtained in both the gain and the phase, and as for the cut-off frequency fc also, in contrast to 28.8 kHz of the comparison example, a value of 28.2 kHz, which is almost the same, is obtained.

In FIG. 7, a comparison of each parameter (dielectric film thickness, capacity per unit area), and a comparison of the surface area of the capacitors, resistors, and operational amplifiers in a fourth order low pass filter, and in a conventional example, are shown. Here, a case in which a Conventional Example 1 uses a capacitor of a construction in which an interlayer insulating film (film thickness: about 700 nm) is sandwiched by a polysilicon layer or a metal layer and a metal layer, and a case in which Conventional Example 2 uses a capacitor of a construction in which a dielectric film (film thickness: 50 nm) is sandwiched by two polysilicon layers, are shown. In a fourth order low pass filter, two operational amplifiers are necessary, and furthermore, in the case of this invention, two conventional amplifiers used as their respective DC bias circuits become necessary. Since the MOS transistor M used for the DC bias circuit requires almost no surface area, it can be omitted from the calculations, and the resistor R7 is shared between the two DC bias circuits.

As is shown in FIG. 7, the total dedicated surface area for a fourth order low, pass filter to which this convention is applied is 23% of Conventional Example 1 and 77% of Conventional Example 2, so it can be seen that a reduction in the surface area can be designed.

As for the filter related to this embodiment configuration, a small surface area can be achieved due to the fact that it has a capacitor that uses the gate insulating film of an MOS transistor or the like as a capacitor dielectric film. Because it has a means (DC bias circuit) that applies a prescribed DC bias to this capacitor, a channel for an MOS transistor that constructs the capacitor can be ordinarily formed, and the capacitor value can be held constant. The overall surface area occupied by the filter circuit containing this DC bias circuit is also small.

The forming process for the capacitor can be made common with the forming process for an MOS transistor, and it becomes a device that is particularly suitable to a mixed loading of memory and logic.

From the above, [it can be seen that] by means of this invention, it becomes possible to realize a low cost filter circuit that is suitable for high integration.

According to the filter circuit related to this invention, it becomes possible to offer a filter circuit in which the dedicated capacitor surface area is small, and a dedicated process just for the forming of the capacitor is unnecessary.

What is claimed is:

1. A filter circuit comprising an operational amplifier, a plurality of resistors electrically connected to the operational amplifier, an input terminal for receiving an input signal coupled to the operational amplifier through at least one of the plurality of resistors, and an output terminal coupled to an output of the operational amplifier for providing an output signal, a plurality of capacitors electrically connected to the operational amplifier, wherein at least one of said plurality of capacitors comprise a source and drain of a MOS transistor connected together to form a first electrode of the capacitor, and a gate of the MOS transistor forming a second electrode of the capacitor, a DC bias means coupled to said output of said amplifier for applying a predetermined DC bias voltage across the electrodes of the capacitor, for stabilizing capacitance of the capacitor and wherein the operational amplifier, the resistors, the capacitors, and the DC bias means are formed on the same semiconductor substrate.

2. A filter circuit comprising a first operational amplifier, a plurality of resistors electrically connected to the first operational amplifier, an input terminal for receiving an input signal coupled to the operational amplifier through at least one of the plurality of resistors, and an output terminal coupled to an output of the operational amplifier for providing an output signal, a plurality of capacitors electrically connected to the first operational amplifier, wherein at least one of said plurality of capacitors comprise a source and drain of a first MOS transistor connected together to form a first electrode of the capacitor, and a gate of the MOS transistor forming a second electrode of the capacitor, a DC bias means applying a predetermined DC bias voltage across the electrodes of the capacitor, and wherein the first operational amplifier, the resistors, the capacitors, and the DC bias means are formed on the same semiconductor substrate, wherein first and second resistors of the plurality of resistors are connected in series between said input terminal and a non-inverted input terminal of the first operational amplifier, a first capacitor of the plurality of capacitors is connected between the non-inverted input terminal and ground, a second capacitor of the plurality of capacitors and the DC bias means are connected in series between a junction of the first and second resistors and the inverted input terminal of the first operational amplifier, and the inverted input terminal is connected to the output terminal of the first operational amplifier.

3. A filter circuit of claim 2 wherein the DC bias means contains a third and fourth resistor that are connected in series between the output terminal of the first operational amplifier and ground, a fifth resistor and a second MOS transistor that are connected in series between a power supply voltage and ground, a sixth and seventh resistor that are connected in series between the junction of the fifth resistor and the second MOS transistor and the second capacitor, and a second operational amplifier in which a non-inverted input terminal is connected to the junction of the third and fourth resistors, an inverted input terminal is connected to the junction of the sixth and seventh resistors, and an output terminal is connected to the junction of the second capacitor and the seventh resistor, and a diode is formed by connecting the gate and drain of the second MOS transistor.

4. A filter circuit comprising an operational amplifier, a plurality of resistors electrically connected to the operational amplifier, an input terminal for receiving an input signal coupled to the operational amplifier through at least one of the plurality of resistors, and an output terminal coupled to an output of the operational amplifier for receiving an output signal, a plurality of capacitors electrically connected to the operational amplifier, wherein at least one of said plurality of capacitors comprise a source and drain of a first MOS transistor connected together to form a first electrode of the capacitor, and a gate of the MOS transistor forming a second electrode of the capacitor, a DC bias means applying a predetermined DC bias voltage across the electrodes of the capacitor, and wherein the operational amplifier, the resistors, the capacitors, and the DC bias means are formed on the same semiconductor substrate, wherein, a first capacitor of the plurality of capacitors, the DC bias means, and a second capacitor of the plurality of capacitors are connected in series between the signal input terminal and the non-inverted input terminal of the operational amplifier, a first resistor of the plurality of resistors is connected between the non-inverted input terminal and ground, a second resistor of the plurality of resistors is connected between the junction of the first capacitor and the DC bias means and the inverted input terminal of the operational amplifier, and the inverted input terminal and output terminal of the operational amplifier are connected.

* * * * *